US012716969B2

(12) United States Patent
Akushichi et al.

(10) Patent No.: US 12,716,969 B2
(45) Date of Patent: Aug. 25, 2026

(54) MAGNETIC SENSOR

(71) Applicant: TDK Corporation, Tokyo (JP)

(72) Inventors: Taiju Akushichi, Tokyo (JP); Tamon Kasajima, Tokyo (JP)

(73) Assignee: TDK Corporation, Tokyo (JP)

( * ) Notice: Subject to any disclaimer, the term of this patent is extended or adjusted under 35 U.S.C. 154(b) by 109 days.

(21) Appl. No.: 18/549,713

(22) PCT Filed: Feb. 24, 2022

(86) PCT No.: PCT/JP2022/007591
§ 371 (c)(1),
(2) Date: Sep. 8, 2023

(87) PCT Pub. No.: WO2022/209462
PCT Pub. Date: Oct. 6, 2022

(65) Prior Publication Data

US 2024/0151785 A1 May 9, 2024

(30) Foreign Application Priority Data

Mar. 29, 2021 (JP) ................................ 2021-054652

(51) Int. Cl.
*G01R 33/09* (2006.01)
*G01R 33/00* (2006.01)

(52) U.S. Cl.
CPC ........ *G01R 33/091* (2013.01); *G01R 33/0011* (2013.01)

(58) Field of Classification Search
CPC ...... G01R 33/06; G01R 33/07; G01R 33/072; G01R 33/075; G01R 33/09; G01R 33/093;

(Continued)

(56) References Cited

U.S. PATENT DOCUMENTS 4,665,362 A * 5/1987 Abel ...................... G01D 5/147 324/207.2
9,116,018 B2 * 8/2015 Frachon ................ G01D 5/147

(Continued)

FOREIGN PATENT DOCUMENTS

CN 110709720 A 1/2020
JP 3152085 B2 4/2001

(Continued)

OTHER PUBLICATIONS

International Search Report issued in corresponding International Patent Application No. PCT/JP2022/007591, dated May 10, 2022, with English translation.

*Primary Examiner* — David M Schindler
(74) *Attorney, Agent, or Firm* — Rimon P.C.

(57) ABSTRACT

To provide a magnetic sensor capable of detecting a weak magnetic field at a position situated apart from a magnetic field source. A magnetic sensor includes magnetic bodies whose magnetic collecting surfaces face mutually opposite sides and a magnetic detecting part 30 that detects magnetic flux passing between the magnetic bodies. With this configuration, magnetic flux collected from one magnetic collecting surface of one magnetic body passes to another magnetic collecting surface of another magnetic body through the magnetic detecting part, thereby making it possible to efficiently collect a magnetic field spreading in a space. Thus, even when a distance from a magnetic field source is large, magnetic collection can be achieved with high uniformity of a magnetic field.

5 Claims, 8 Drawing Sheets

(58) Field of Classification Search
CPC .. G01R 33/095; G01R 33/096; G01R 33/098; G01R 33/0011; G01R 33/02; G01D 5/142; G01D 5/145; G01D 5/147; G01D 5/16; G01D 5/165; G01B 7/14; G01B 7/30
See application file for complete search history.

(56) References Cited

U.S. PATENT DOCUMENTS

| | | | | |
|---|---|---|---|---|
| 2018/0313907 | A1 | 11/2018 | Fukui | |
| 2020/0191885 | A1* | 6/2020 | Lin | G01R 33/093 |
| 2020/0355759 | A1* | 11/2020 | Uchida | G01R 33/0206 |
| 2022/0349960 | A1* | 11/2022 | Akushichi | G01R 33/0011 |

FOREIGN PATENT DOCUMENTS

| | | | |
|---|---|---|---|
| JP | 2018-004618 | A | 1/2018 |
| JP | 6610178 | B2 | 11/2019 |

* cited by examiner

MAGNETIC SENSOR

CROSS REFERENCE TO RELATED APPLICATIONS

This application is the U.S. National Phase under 35 U.S.C. § 371 of International Application No. PCT/JP2022/007591, filed on Feb. 24, 2022, which claims the benefit of Japanese Patent Application No. 2021-054652, filed on Mar. 29, 2021, the entire contents of each are hereby incorporated by reference.

TECHNICAL FIELD

The present invention relates to a magnetic sensor and, more particularly, to a magnetic sensor capable of detecting a weak magnetic field from a position situated apart from a magnetic field source.

BACKGROUND ART

Patent Document 1 discloses a magnetic sensor having detection sensitivity enhanced by collecting a magnetic field in a sensor chip using a bar-like magnetic body.

CITATION LIST

Patent Document

[Patent Document 1] Japanese Patent No. 6,610,178

DISCLOSURE OF THE INVENTION

Problem to be Solved by the Invention

However, the magnetic sensor described in Patent Document 1 needs to perform measurement by bringing a magnetic collector close to a magnetic field source. Thus, it is not easy to detect a weak magnetic field from a position situated apart from a magnetic field source.

It is therefore an object of the present invention to provide a magnetic sensor capable of detecting a weak magnetic field from a position situated apart from a magnetic field source.

Means for Solving the Problem

A magnetic sensor according to the present invention includes: first and second magnetic bodies whose magnetic collecting surfaces face mutually opposite sides; and a magnetic detecting part that detects magnetic flux passing between the first and second magnetic bodies.

According to the present invention, magnetic flux collected from the magnetic collecting surface of the first magnetic body passes through the magnetic collecting surface of the second magnetic body by way of the magnetic detecting part, thereby making it possible to efficiently detect a magnetic field spreading in a space. Thus, even when a distance from a magnetic field source is large, magnetic collection can be achieved with high uniformity of a magnetic field.

In the present invention, the magnetic collecting surface of the first magnetic body and the magnetic collecting surface of the second magnetic body may be parallel to each other. Thus, by making the magnetic collecting surfaces of the first and second magnetic bodies perpendicular to magnetic flux, a weak magnetic field can be detected with high sensitivity.

In this case, the magnetic collecting surfaces may each extend in a first direction and a second direction perpendicular to the first direction, and the first and second magnetic bodies may each include a magnetic coupling part magnetically coupled to the magnetic detecting part and a magnetic collecting part extending in the first direction from the magnetic coupling part and constituting the magnetic collecting surface. This allows magnetic collection efficiency to be controlled by adjusting the size of the magnetic collecting part. Further, in this case, the magnetic collecting part of each of the first and second magnetic bodies may extend to both sides in the first direction from the magnetic coupling part. This makes it possible to further enhance magnetic collection efficiency. Further, the magnetic collecting part of each of the first and second magnetic bodies may have a part extending in the second direction from the magnetic coupling part. In this case as well, magnetic collection efficiency can be further enhanced.

Advantageous Effects of the Invention

As described above, according to the present invention, it is possible to provide a magnetic sensor capable of detecting a weak magnetic field at a position situated apart from a magnetic field source.

BRIEF DESCRIPTION OF THE DRAWINGS

FIG. 1 is a schematic view for explaining the structure of a magnetic sensor 1 according to a first embodiment of the present invention, where

MODE FOR CARRYING OUT THE INVENTION

Hereinafter, preferred embodiments of the present invention will be described in detail with reference to the accompanying drawings.

First Embodiment

Figures 1A, 1B:
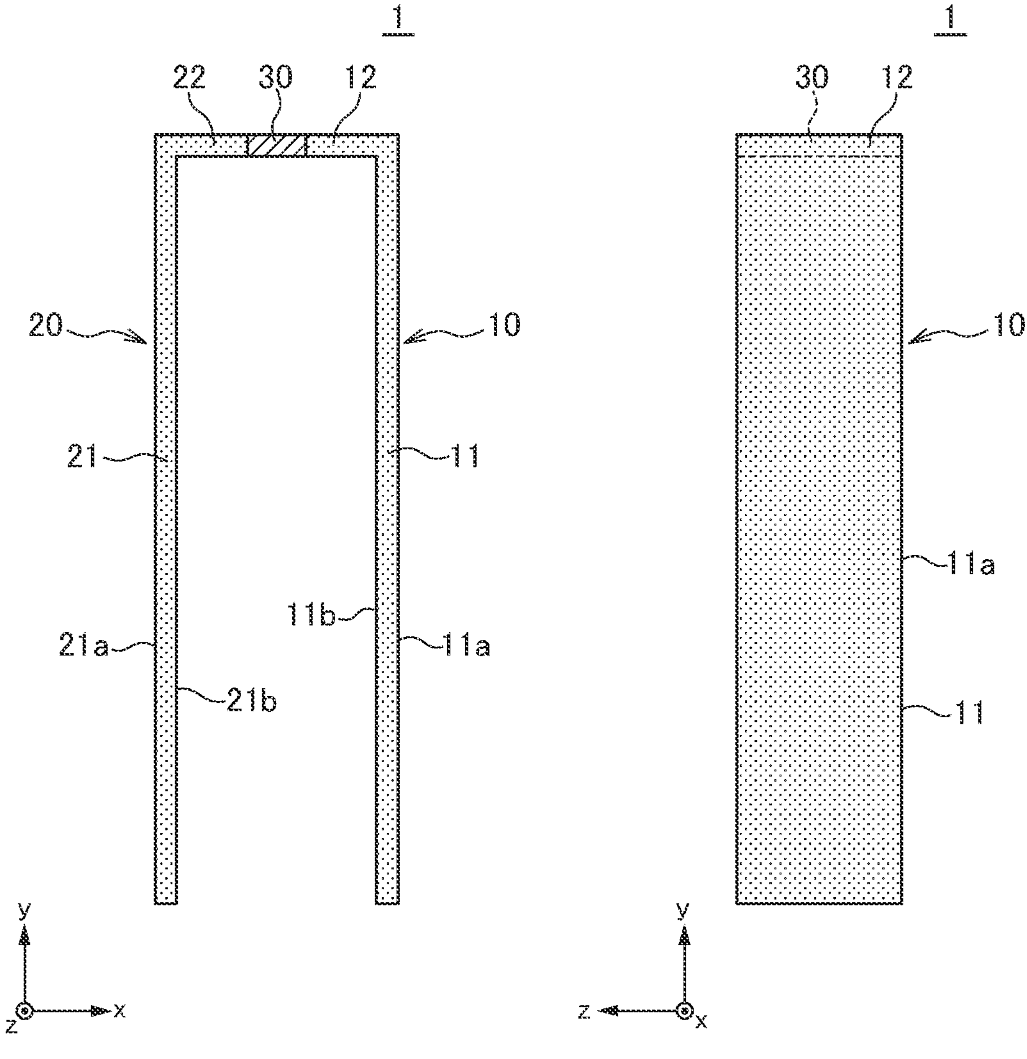
FIG. 1A is an xy plan view and FIG. 1B is a yz plan view.

FIG. 1 is a schematic view for explaining the structure of a magnetic sensor 1 according to a first embodiment of the present invention. FIG. 1A is an xy plan view and FIG. 1B is a yz plan view.

As illustrated in FIG. 1, the magnetic sensor 1 according to the first embodiment includes magnetic bodies 10, 20 and a magnetic detecting part 30. The magnetic bodies 10 and 20 are each made of a high-permeability material such as ferrite and respectively have magnetic collecting parts 11 and 21 for collecting a magnetic field to be detected and magnetic coupling parts 12 and 22 that are magnetically coupled to the magnetic detecting part 30 and apply the collected magnetic flux to the magnetic detecting part 30.

The magnetic collecting part 11 has a magnetic collecting surface 11*a* constituting the yz plane and a back surface 11*b* positioned on the opposite side from the magnetic collecting surface 11*a*, and the magnetic collecting part 12 has a magnetic collecting surface 21*a* constituting the yz plane and a back surface 21*b* positioned on the opposite side of the magnetic collecting surface 21*a*. The magnetic collecting surfaces 11*a* and 21*a* face mutually opposite sides, and the back surfaces 11*b* and 21*b* face each other. Thus, the magnetic collecting surfaces 11*a* and 21*a* are parallel to each other. The magnetic detecting part 30 is sandwiched between the magnetic coupling part 12 of the magnetic body 10 and the magnetic coupling part 22 of the magnetic body 20 in the X-direction, thereby detecting the direction and strength of magnetic flux passing between the magnetic coupling part 12 of the magnetic body 10 and the magnetic coupling part 22 of the magnetic body 20.

Figure 2A:
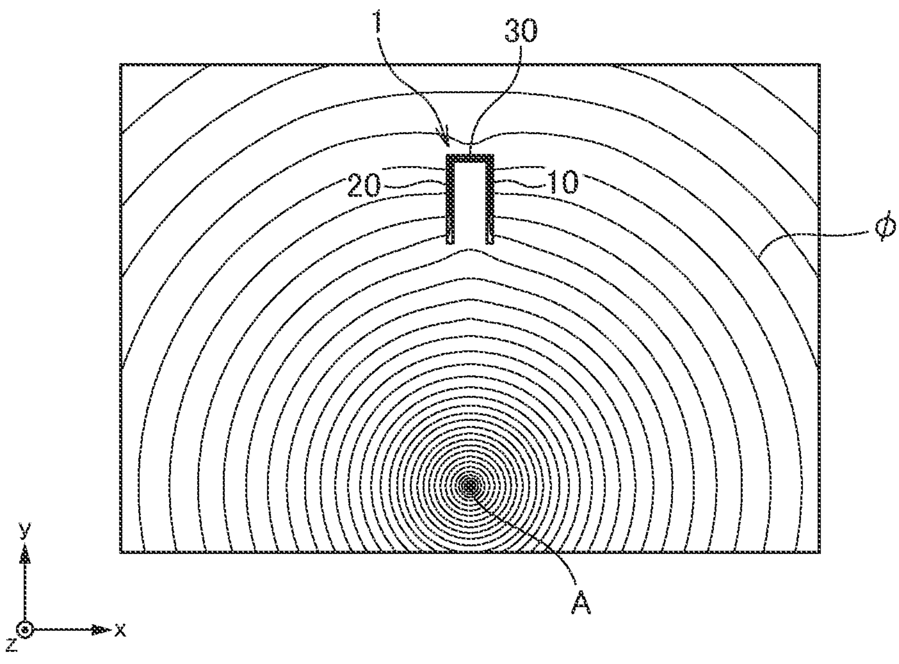
FIG. 2A is a schematic view for explaining a method of detecting a magnetic field using the magnetic sensor 1.
Figure 2B:
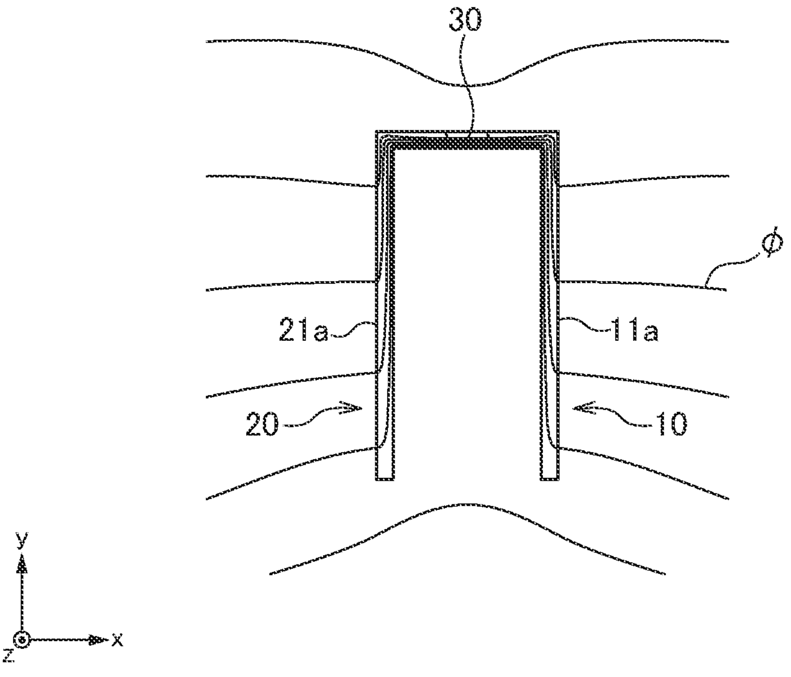
FIG. 2B is an enlarged view of FIG. 2A.

FIG. 2A is a schematic view for explaining a method of detecting a magnetic field using the magnetic sensor 1, and FIG. 2B is an enlarged view of FIG. 2A.

As illustrated in FIGS. 2A and 2B, the magnetic sensor 1 according to the present embodiment detects magnetic flux $\phi$ at a position situated apart from a magnetic field source A. A magnetic flux density is lower at a position situated apart from the magnetic field source A than at a position in the vicinity of the magnetic field source A; however, uniformity of a magnetic field is higher at a position situated apart from the magnetic field source A than at a position in the vicinity of the magnetic field source A. Such magnetic flux $\phi$ having high uniformity is collected using the magnetic collecting surfaces 11*a* and 21*a* and applied to the magnetic detecting part 30. This makes it possible to efficiently detect a magnetic field spreading in a space apart from the magnetic field source A.

As described above, the magnetic sensor 1 according to the present embodiment collects a magnetic field spreading in a space using the magnetic collecting surfaces 11*a* and 21*a* facing mutually opposite sides. Thus, for example, even when it is difficult to bring a magnetic sensor close to the magnetic field source A due to the presence of an obstacle, it is possible to detect a weak magnetic field at a position situated apart from the magnetic field source A.

Second Embodiment

Figure 3:
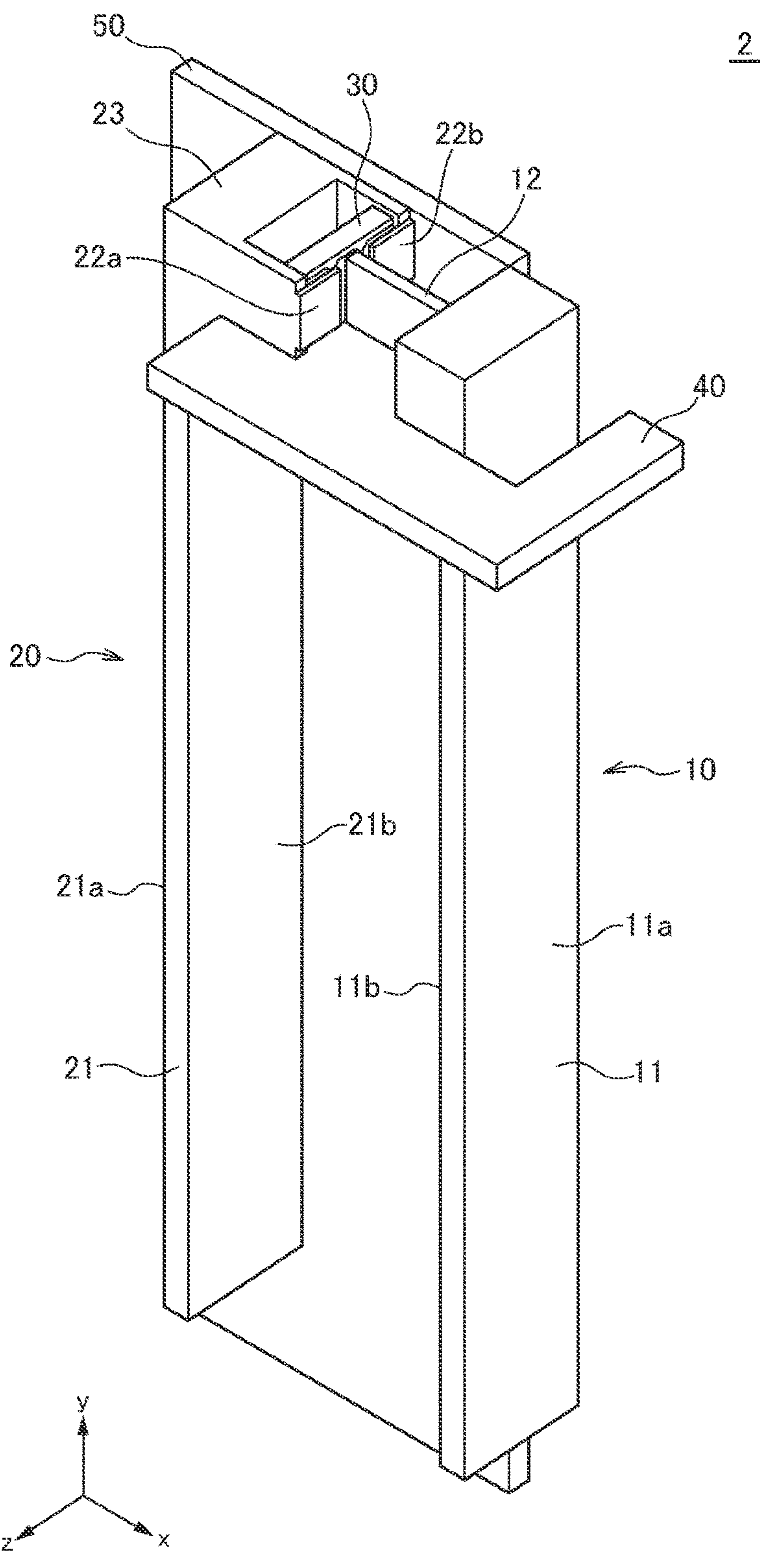
FIG. 3 is a schematic perspective view for explaining the structure of a magnetic sensor 2 according to a second embodiment of the present invention.
Figure 4:
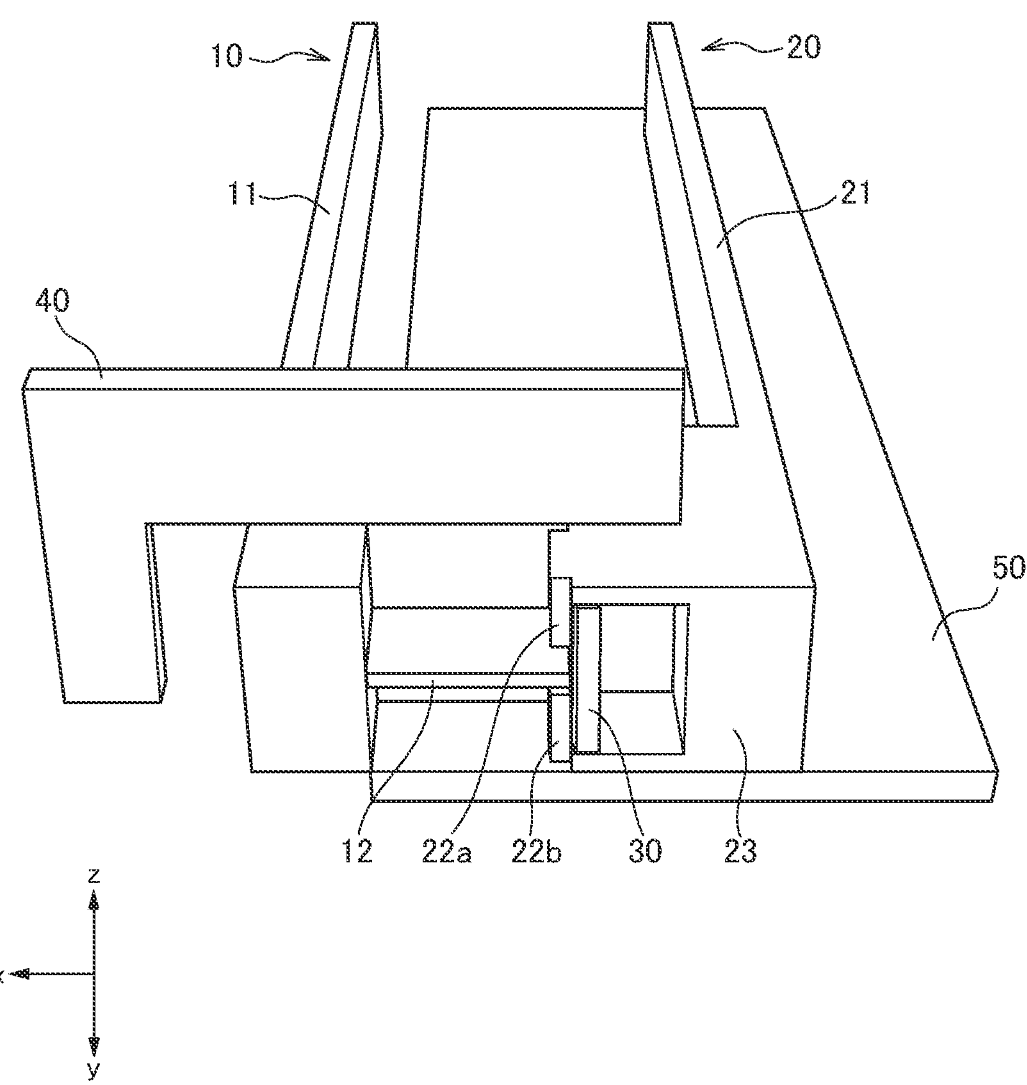
FIG. 4 is a schematic perspective view for explaining the structure of a magnetic sensor 2 according to the second embodiment of the present invention.

FIGS. 3 and 4 are schematic perspective views for explaining the structure of a magnetic sensor 2 according to a second embodiment of the present invention.

As illustrated in FIGS. 3 and 4, the magnetic sensor 2 according to the second embodiment differs from the magnetic sensor 1 according to the first embodiment in that it uses a sensor chip as the magnetic detecting part 30 and further includes a substrate 40 mounting thereon the senor chip and a support 50 supporting the substrate 40 and magnetic body 20. Other basic configurations are the same as those of the magnetic sensor 1 according to the first embodiment, so the same reference numerals are given to the same elements, and overlapping description will be omitted.

The substrate 40 has a main surface constituting the xz plane, on which the sensor chip constituting the magnetic detecting part 30, the magnetic coupling part 12 of the magnetic body 10, and magnetic coupling parts 22*a* and 22*b* of the magnetic body 20 are placed. The magnetic coupling part of the magnetic body 20 is thus divided into the magnetic coupling parts 22*a* and 22*b*. The support 50 has a main surface constituting the xy plane, on which the substrate 40 and magnetic body 20 are supported.

Figure 5:
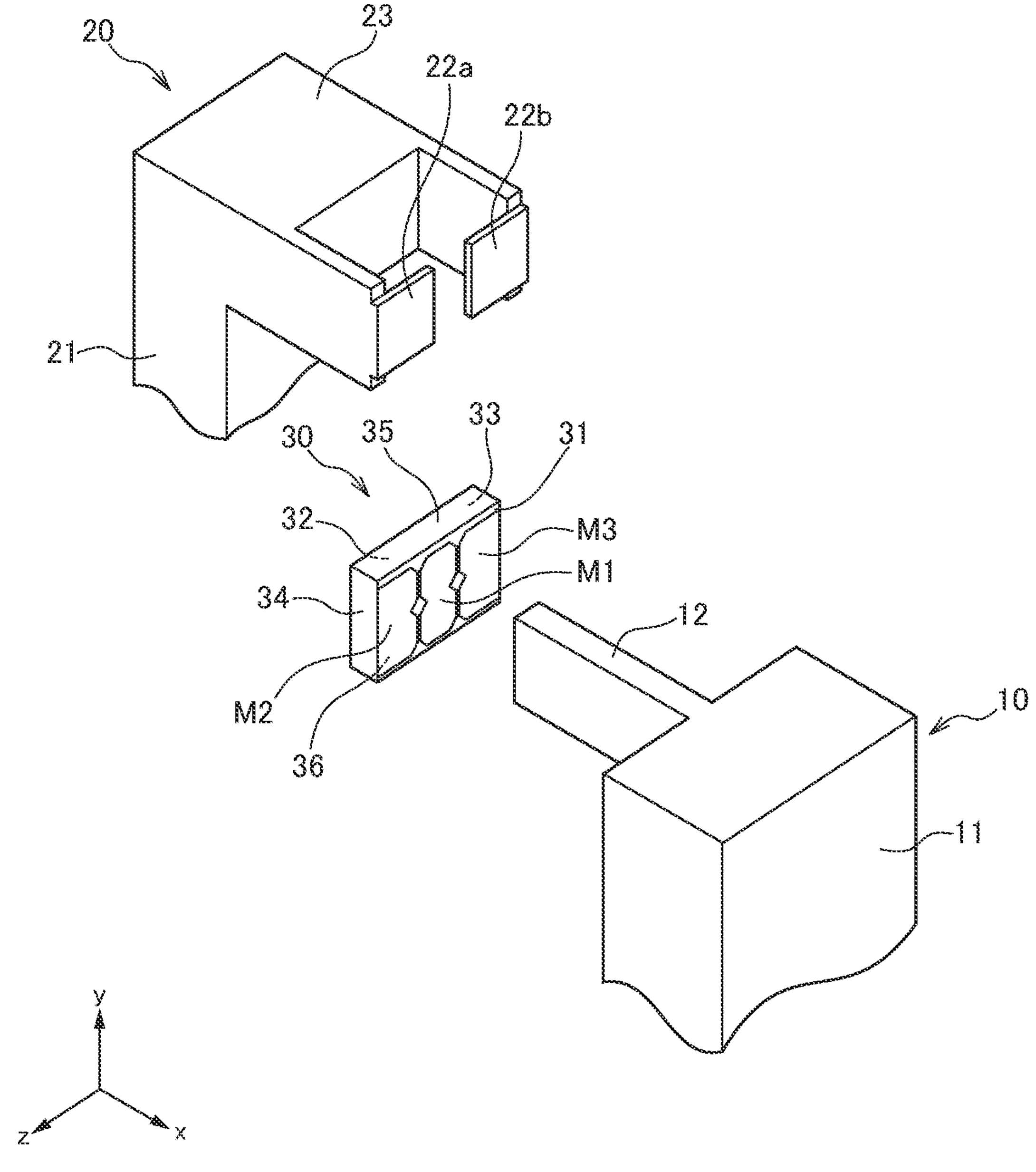
FIG. 5 is a schematic exploded perspective view illustrating a state where the sensor chip constituting the magnetic detecting part 30 is separated from the magnetic bodies 10 and 20.

FIG. 5 is a schematic exploded perspective view illustrating a state where the sensor chip constituting the magnetic detecting part 30 is separated from the magnetic bodies 10 and 20.

As illustrated in FIG. 5, the sensor chip constituting the magnetic detecting part 30 has an element forming surface 31 and a back surface 32 which constitute the yz plane, side surfaces 33 and 34 which constitute the xy plane, and side surfaces 35 and 36 which constitute the xz plane. On the element forming surface 31 of the sensor chip, a magnetosensitive element to be described later and magnetic layers M1 to M3 are formed. The side surface 36 of the sensor chip faces the substrate 40.

A part of the magnetic body 10 that constitutes the magnetic coupling part 12 has a bar-like shape elongated in the x-direction, and one end thereof in the x-direction is positioned at substantially the center of the element forming surface 31 in the z-direction so as to partly cover the magnetic layer M1. The magnetic body 20 has an area 23 extending in the x-direction. An end portion of the area 23 on the sensor chip side is separated in two. The two separated end portions extend in the x-direction and are bent in the z-direction so as to face each other. The parts bent in the z-direction constitute the magnetic coupling parts 22*a* and 22*b* of the magnetic body 20. The magnetic coupling parts 22*a* and 22*b* partly cover the magnetic layers M2 and M3, respectively.

Figure 6:
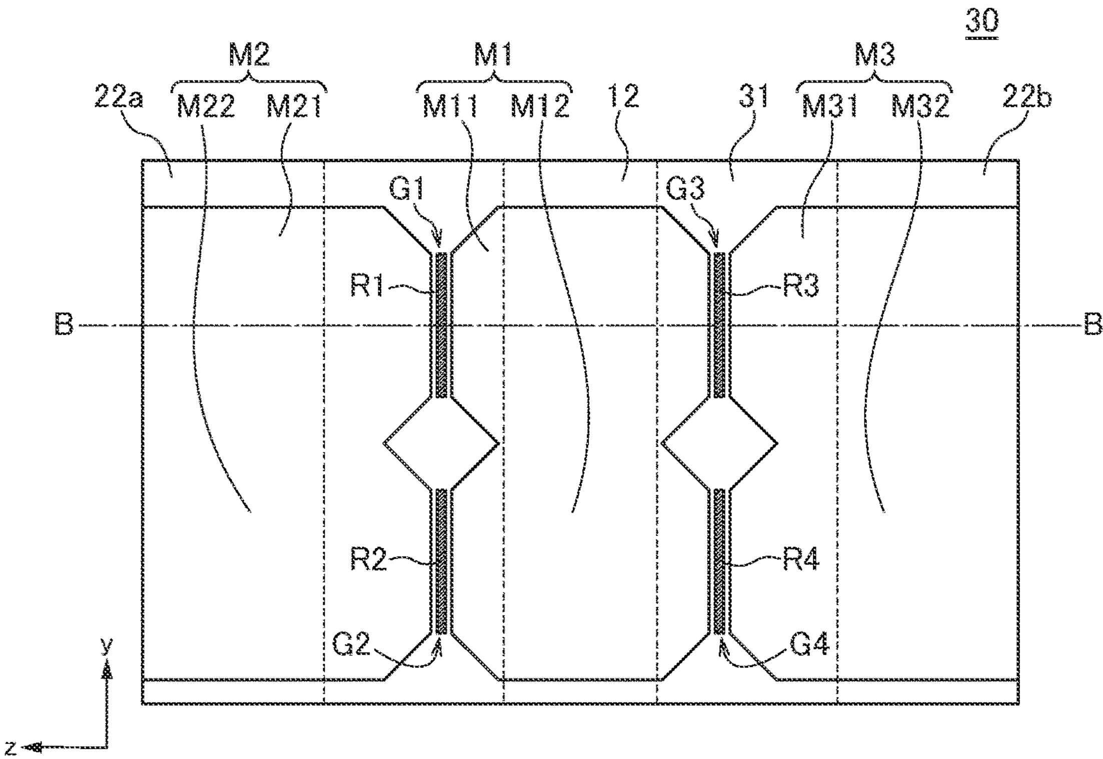
FIG. 6 is a schematic plan view of the sensor chip constituting the magnetic detecting part 30.
Figure 7:
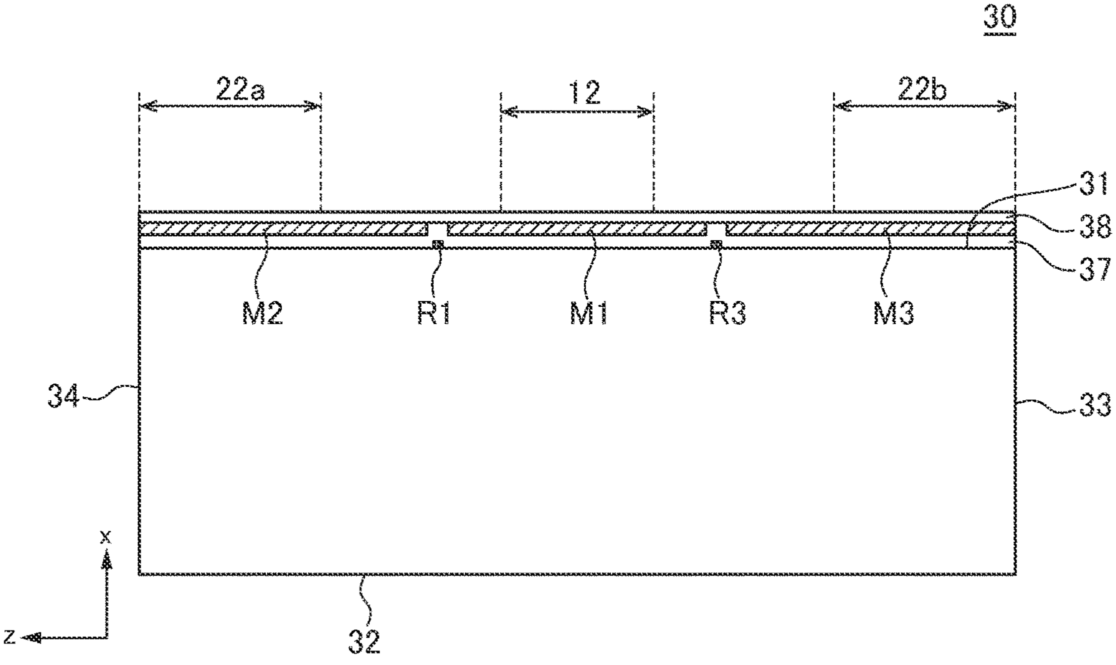
FIG. 7 is a schematic cross-sectional view taken along the line B-B in FIG. 6.

FIG. 6 is a schematic plan view of the sensor chip constituting the magnetic detecting part 30, and FIG. 7 is a schematic cross-sectional view taken along the line B-B in FIG. 6.

As illustrated in FIGS. 6 and 7, four magnetosensitive elements R1 to R4 are formed on the element forming surface 31 of the sensor chip. The magnetosensitive elements R1 to R4 are not particularly limited in type as long as they are elements whose electric resistance varies depending on the direction of magnetic flux and may be, for example, an MR element. The fixed magnetization direction of the magnetosensitive elements R1 to R4 are the same direction (for example, positive z-direction). The magnetosensitive elements R1 to R4 are covered with an insulating layer 37, and the magnetic layers M1 to M3 each made of permalloy are formed on the surface of the insulating layer 37. The magnetic layers M1 to M3 are covered with an insulating layer 38. Assume that parts of the respective magnetic layers M1 to M3 that are positioned at one side (upper side in FIG. 7) in the y-direction are defined as magnetic layers M11, M21, and M31, and parts of the respective magnetic layers M1 to M3 that are positioned at the other side (lower side in FIG. 7) in the y-direction are defined as magnetic layers M12, M22, and M32. In this case, in a plan view (as viewed in the x-direction), the magnetosensitive element R1 is positioned between the magnetic layers M11 and M21, the magnetosensitive element R2 is positioned between the magnetic layers M12 and M22, the magnetosensitive element R3 is positioned between the magnetic layers M11 and M31, and the magnetosensitive element R4 is positioned between the magnetic layers M12 and M32. With this configuration, magnetic fields passing through respective magnetic gaps G1 to G4 are applied respectively to the magnetosensitive elements R1 to R4. The direction of the magnetic fields applied respectively to the magnetosensitive elements R1 and R2 and the direction of the magnetic fields applied respectively to the magnetosensitive elements R3 and R4 differ from each other by 180°, so that by bridge-connecting the magnetosensitive elements R1 to R4, the direction and strength of magnetic flux to be applied through the magnetic body 10 can be detected.

However, in the present invention, each of the magnetosensitive elements R1 to R4 need not necessarily be disposed between two magnetic layers but only needs to be disposed near each of its corresponding magnetic gaps G1 to G4 formed by two magnetic layers, i.e., on a magnetic path formed by each of the magnetic gaps G1 to G4. Further, the magnetic gaps G1 to G4 need not necessarily be larger in width than the magnetosensitive elements R1 to R4 but may be smaller in width than the magnetosensitive elements R1 to R4.

In FIGS. 6 and 7, the area designated by a reference numeral 12 is an area covered with the magnetic coupling part 12 of the magnetic body 10, and the areas designated by reference numerals **22*a* and 22*b* are areas covered respectively with the magnetic coupling parts 22*a* and 22*b* of the magnetic body 20. As illustrated in FIGS. 6 and 7, the magnetic coupling part 12 of the magnetic body 10 covers the magnetic layer M1, and the magnetic coupling parts 22*a* and 22*b* of the magnetic body 20 cover the magnetic layers M2 and M3**, respectively.

With the above configuration, magnetic flux collected through the magnetic collecting surface **11*a* of the magnetic body 10 passes to the magnetic collecting surface 21*a* of the magnetic body 20 through the magnetic layers M1 to M3, and the magnetosensitive elements R1 to R4 are disposed respectively to the magnetic gaps G1 to G4 formed by the magnetic layers M1 to M3**, thereby making it possible to efficiently detect a magnetic field spreading in a space apart from the magnetic field source A.

Third Embodiment

Figure 8:
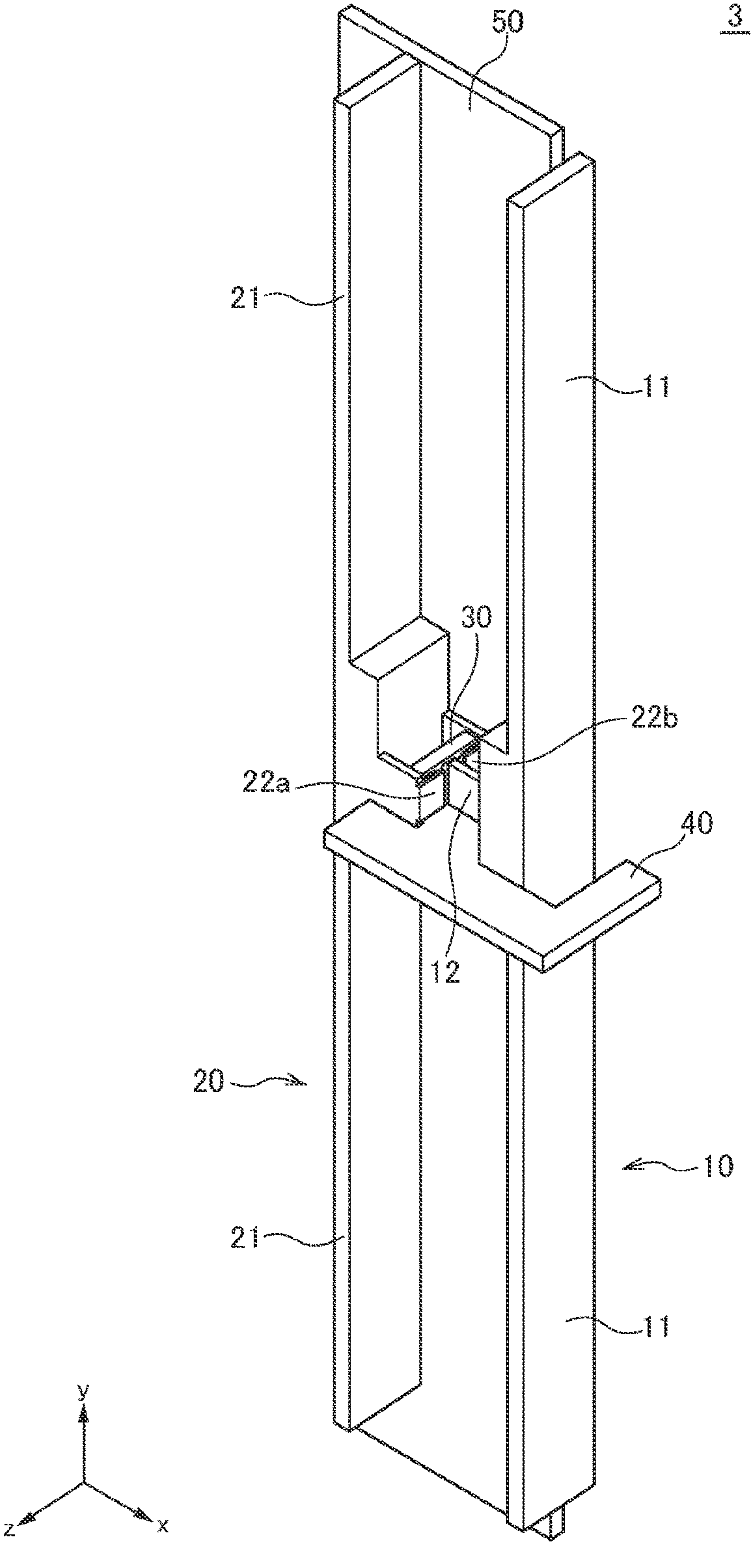
FIG. 8 is a schematic perspective view for explaining the structure of a magnetic sensor 3 according to a third embodiment of the present invention.

FIG. 8 is a schematic perspective view for explaining the structure of a magnetic sensor 3 according to a third embodiment of the present invention.

As illustrated in FIG. 8, the magnetic sensor 3 according to the third embodiment differs from the magnetic sensor 2 according to the second embodiment in that the magnetic collecting parts 11 and 21 of the magnetic bodies 10 and 20 extend from the magnetic coupling parts 12 and 22 to both sides in the y-direction. Other basic configurations are the same as those of the magnetic sensor 2 according to the second embodiment, so the same reference numerals are given to the same elements, and overlapping description will be omitted.

As exemplified by the magnetic sensor 2 illustrated in FIG. 8, when the magnetic collecting parts 11 and 21 of the magnetic bodies 10 and 20 are made to extend to both sides in the y-direction, the magnetic collecting surfaces **11*a* and 21*a*** are increased in area, making it possible to detect a magnetic field spreading in a space apart from the magnetic field source A with higher sensitivity.

Fourth Embodiment

Figure 9:
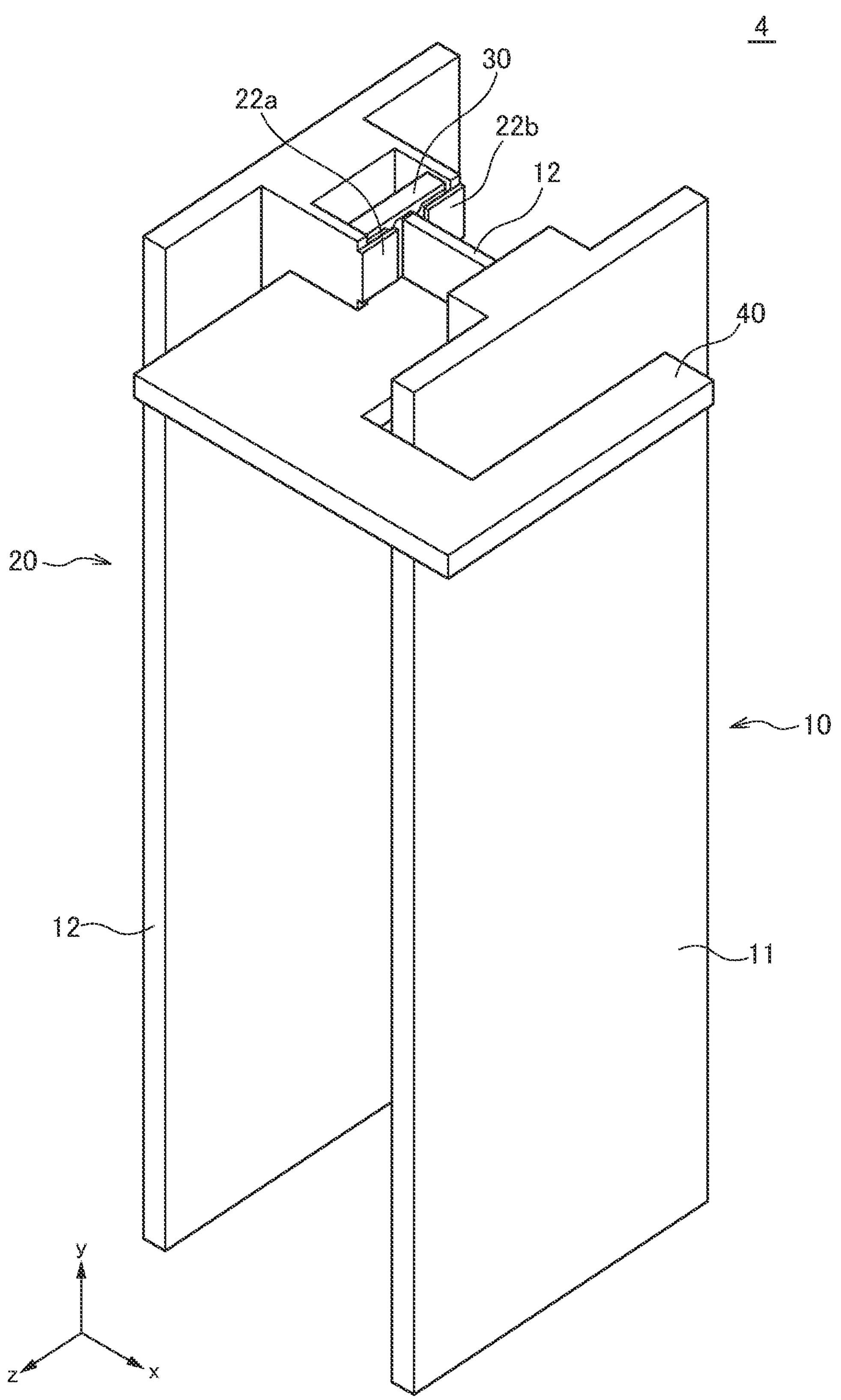
FIG. 9 is a schematic perspective view for explaining the structure of a magnetic sensor 4 according to a fourth embodiment of the present invention.

FIG. 9 is a schematic perspective view for explaining the structure of a magnetic sensor 4 according to a fourth embodiment of the present invention.

As illustrated in FIG. 9, the magnetic sensor 4 according to the fourth embodiment differs from the magnetic sensor 2 according to the second embodiment in that the magnetic collecting parts 11 and 21 of the magnetic bodies 10 and 20 extend from the magnetic coupling parts 12 and 22 not only in the y-direction but also in the z-direction. Other basic configurations are the same as those of the magnetic sensor 2 according to the second embodiment, so the same reference numerals are given to the same elements, and overlapping description will be omitted.

As exemplified by the magnetic sensor 4 illustrated in FIG. 9, an increase in the width of each of the magnetic collecting parts 11 and 21 of the magnetic bodies 10 and 20 in the z-direction makes it possible to detect a magnetic field spreading in a space apart from the magnetic field source A with higher sensitivity.

While the preferred embodiment of the present disclosure has been described, the present disclosure is not limited to the above embodiment, and various modifications may be made within the scope of the present disclosure, and all such modifications are included in the present disclosure.

REFERENCE SIGNS LIST

1-4 magnetic sensor
10, 20 magnetic body
11, 21 magnetic collecting part
**11*a*, 21*a*** magnetic collecting surface
**11*b*, 21*b*** back surface
12, 22, **22*a*, 22*b*** magnetic collecting part
23 area
30 magnetic detecting part
31 element forming surface
32 back surface
33-36 side surface
37, 38 insulating layer
40 substrate
50 support
A magnetic field source
G1-G4 magnetic gap
M1-M3, M11, M21, M31, M12, M22, M32 magnetic layer
R1-R4 magnetosensitive element
ϕ magnetic flux

What is claimed is:

1. A magnetic sensor comprising:

a first magnetic body having i) a first magnetic collecting surface extending in a first direction and a second direction perpendicular to the first direction and ii) a first back surface positioned on an opposite side of the first magnetic collecting surface;

a second magnetic body having i) a second magnetic collecting surface extending in the first and second directions and ii) a second back surface positioned on an opposite side of the second magnetic collecting surface; and a sensor chip having an element forming surface on which a magnetosensitive element is formed, wherein the first and second magnetic bodies are arranged such that the first back surface of the first magnetic body and the second back surface of the second magnetic body face each other, wherein the first magnetic body has a first magnetic coupling part protruding toward the second magnetic body along a third direction perpendicular to the first and second directions, wherein the second magnetic body has i) a first protruding portion protruding toward the first magnetic body along the third direction, ii) a second protruding portion protruding in parallel with the first protruding portion toward the first magnetic body along the third direction, iii) a second magnetic coupling part protruding from the first protruding portion along the second direction, and iv) a third magnetic coupling part protruding from the second protruding portion along the second direction, wherein the second magnetic coupling part includes an end surface extending in the third direction and the first direction, and the third magnetic coupling part includes an end surface extending in the third direction and the first direction such that the end surface of the second magnetic coupling part and the end surface of the third magnetic coupling part face each other, and wherein the sensor chip is arranged such that at least a part of the element forming surface is covered with the first magnetic coupling part, the second magnetic coupling part, and the third magnetic coupling part and such that the first magnetic coupling part is arranged between the end surface of the second magnetic coupling part and the end surface of the third magnetic coupling part in the second direction.

2. The magnetic sensor as claimed in claim 1, further comprising a first substrate having a first surface extending in the second and third directions, wherein the sensor chip is mounted on the first surface of the first substrate.

3. The magnetic sensor as claimed in claim 2, wherein the first magnetic coupling part is mounted on the first surface of the first substrate.

4. The magnetic sensor as claimed in claim 3, wherein the second magnetic coupling part and the third magnetic coupling part are mounted on the first surface of the first substrate.

5. The magnetic sensor as claimed in claim 2, further comprising a second substrate having a second surface extending in the first and third directions, wherein the second magnetic body and the first substrate are mounted on the second surface of the second substrate.

* * * * *